(12) United States Patent
Brown et al.

(10) Patent No.: US 11,205,626 B2
(45) Date of Patent: *Dec. 21, 2021

(54) CORELESS ORGANIC PACKAGES WITH EMBEDDED DIE AND MAGNETIC INDUCTOR STRUCTURES

(71) Applicant: Intel Corporation, Santa Clara, CA (US)

(72) Inventors: Andrew J. Brown, Phoenix, AZ (US); Rahul Jain, Gilbert, AZ (US); Prithwish Chatterjee, Tempe, AZ (US); Lauren A. Link, Mesa, AZ (US); Sai Vadlamani, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/875,417

(22) Filed: May 15, 2020

(65) Prior Publication Data

US 2020/0279819 A1 Sep. 3, 2020

Related U.S. Application Data

(63) Continuation of application No. 16/119,923, filed on Aug. 31, 2018, now Pat. No. 10,700,021.

(51) Int. Cl.
*H01L 23/48* (2006.01)
*H01L 21/48* (2006.01)
(Continued)

(52) U.S. Cl.
CPC ........ *H01L 23/645* (2013.01); *H01L 21/4853* (2013.01); *H01L 21/4857* (2013.01);
(Continued)

(58) Field of Classification Search
CPC . H01L 24/13; H01L 24/19–20; H01L 23/544; H01L 23/645
See application file for complete search history.

(56) References Cited

U.S. PATENT DOCUMENTS

| 7,901,984 B2 | 3/2011 | Smeys et al. |
| 10,297,563 B2 | 5/2019 | Jain et al. |
| 10,367,415 B1 | 7/2019 | Sturcken et al. |
| 10,700,021 B2 * | 6/2020 | Brown ................. H01L 21/78 |

(Continued)

OTHER PUBLICATIONS

"U.S. Appl. No. 16/119,923, Non Final Office Action dated Nov. 15, 2019", 15 pgs.

(Continued)

*Primary Examiner* — Hoa B Trinh
(74) *Attorney, Agent, or Firm* — Schwegman Lundberg & Woessner, P.A.

(57) ABSTRACT

A coreless semiconductor package comprises a plurality of horizontal layers of dielectric material. A magnetic inductor is situated at least partly in a first group of the plurality of layers. A plated laser stop is formed to protect the magnetic inductor against subsequent acidic processes. An EMIB is situated above the magnetic inductor within a second group of the plurality of layers. Vias and interconnections are configured within the horizontal layers to connect a die of the EMIB to other circuitry. A first level interconnect is formed on the top side of the package to connect to the interconnections. BGA pockets and BGA pads are formed on the bottom side of the package. In a second embodiment a polymer film is used as additional protection against subsequent acidic processes. The magnetic inductor comprises a plurality of copper traces encapsulated in magnetic material.

30 Claims, 14 Drawing Sheets

(51) Int. Cl.
*H01L 23/64* (2006.01)
*H01L 23/538* (2006.01)
*H01L 23/00* (2006.01)
*H01L 21/683* (2006.01)
*H01L 21/78* (2006.01)

(52) U.S. Cl.
CPC .......... *H01L 21/6835* (2013.01); *H01L 21/78* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2221/68372* (2013.01); *H01L 2224/214* (2013.01); *H01L 2224/215* (2013.01); *H01L 2924/0105* (2013.01); *H01L 2924/01028* (2013.01); *H01L 2924/01029* (2013.01); *H01L 2924/01046* (2013.01); *H01L 2924/01047* (2013.01); *H01L 2924/01079* (2013.01); *H01L 2924/1431* (2013.01); *H01L 2924/1434* (2013.01); *H01L 2924/19042* (2013.01); *H01L 2924/19103* (2013.01)

(56) References Cited

U.S. PATENT DOCUMENTS

| | | | |
|---|---|---|---|
| 2013/0049182 A1* | 2/2013 | Gong | H01L 21/486 257/676 |
| 2013/0200528 A1* | 8/2013 | Lin | H01L 23/3157 257/774 |
| 2020/0075511 A1 | 3/2020 | Brown et al. | |

OTHER PUBLICATIONS

"U.S. Appl. No. 16/119,923, Notice of Allowance dated Feb. 21, 2020", 10 pgs.

"U.S. Appl. No. 16/119,923, Response filed Feb. 12, 2020 to Non Final Office Action dated Nov. 15, 2019", 12 pgs.

"U.S. Appl. No. 16/119,923, Response filed Oct. 15, 2019 to Restriction Requirement dated Aug. 15, 2019", 9 pgs.

"U.S. Appl. No. 16/119,923, Restriction Requirement dated Aug. 15, 2019", 6 pgs.

U.S. Appl. No. 16/119,923, filed Aug. 31, 2018, Coreless Organic Packages With Embedded Die and Magnetic Inductor Structures.

* cited by examiner

CORELESS ORGANIC PACKAGES WITH EMBEDDED DIE AND MAGNETIC INDUCTOR STRUCTURES

This application is a continuation of U.S. patent application Ser. No. 16/119,923, filed Aug. 31, 2018, which is incorporated herein by reference in its entirety.

TECHNICAL FIELD

The disclosed subject matter relates to processes for producing coreless organic semiconductor packages that integrate embedded multi-die interconnect bridges (EMIB) and magnetic inductor structures to improve Input/Output (I/O) density and power delivery efficiency.

BACKGROUND

Current coreless organic semiconductor packages are limited by the high speed I/O density that can be supported by first level interconnect (FLI) configurations, often with a single bump pitch, for example 110 um or 130 um in some configurations. Increased I/O density might be achieved by tighter line spacing, which translates to a less desirable tighter bump pitch for the FLI. However, coreless packaging is desirable because the resultant products have low z-height, and also yield two substrates in the same process time it takes to make one standard core substrate. Use of an embedded multi-die interconnect bridge (EMIB) in such a package addresses the above issue and increases the I/O density several times more than a conventional package without requiring tighter bump pitch. There is also a need to improve power delivery efficiency and at the same time resolve challenges encountered with exposure of the structures of the package to wet chemistries, with resin bleed out during stencil printing, generally resulting in wider keep-out-zones, and with metallization along the surface of the material of the package. Power delivery efficiency can be increased by use of magnetic inductor material, which improves the total inductance of the package. Consequently, there is a need for cordless organic semiconductor substrate packages that have the increased I/O density of EMIBs and the increased power delivery performance that is due to magnetic inductors, in such a way that the magnetic inductors are only very minimally exposed to the foregoing wet chemistry, bleeding and metallization issues.

BRIEF DESCRIPTION OF THE DRAWINGS

FIG. 1 is a representation of plating copper-nickel-copper on both sides of a peelable core for ultimate use in the process of forming ball grid array (BGA) pockets and conductive BGA pads of a coreless semiconductor package, according to some embodiments of the disclosed subject matter.

FIG. 2 is a representation of laminating a buildup (BU) dielectric film onto the plating of FIG. 1, according to some embodiments of the disclosed subject matter.

FIG. 3 is a representation of drilling of vias in the BU film of FIG. 2, plating the vias with copper and plating copper patterns in the BU film, and of laminating a subsequent dielectric BU film on the copper patterns, according to some embodiments of the disclosed subject matter.

FIG. 4 is a representation of drilling a cavity into the BU layers of FIG. 3 and depositing magnetic material in the cavity, according to some embodiments of the disclosed subject matter.

FIG. 5 is a representation of laminating a BU film on the structure of FIG. 4, drilling vias in the laminated BU film, plating the vias with copper, plating copper traces and plating a copper layer used as a laser stop for subsequent processing, according to some embodiments of the disclosed subject matter.

FIG. 6 is a representation of laminating a BU dielectric film on the structure of FIG. 5, and drilling vias, plating the vias with copper, and plating copper traces on the BU film, according to some embodiments of the disclosed subject matter.

FIG. 7 is a representation of forming a BU film on the structure of FIG. 6, drilling a cavity in the BU films, and placing an EMIB die into the cavity, according to some embodiments of the disclosed subject matter.

FIG. 8 is a representation of laminating a BU film to fill the cavity of FIG. 7, drilling vias for electrical connection and plating copper pads, according to some embodiments of the disclosed subject matter.

FIG. 9 is a representation of laminating solder resist (SR) onto the structure of FIG. 8, forming solder resist openings (SRO) and plating an FLI configuration into the SROs, according to some embodiments of the disclosed subject matter.

FIG. 10 is a representation of depaneling the peelable core, according to some embodiments of the disclosed subject matter.

FIG. 11 is a representation of etching the copper-nickel-copper layers of FIG. 1 to create BGA pockets, depositing a copper-bonding organic solderablity preservative and encapsulating inductor traces in the magnetic material, according to some embodiments of the disclosed subject matter.

FIGS. 12-17 are representations of the process steps illustrated in FIGS. 1-6, according to some embodiments of the disclosed subject matter.

FIG. 18 is a representation of laminating a plurality of buildup (BU) dielectric layers onto the BU layer of FIG. 17, according to some embodiments of the disclosed subject matter.

FIG. 19 is a representation of adding a polyethylene tetrafluoride (PET) film to the structure of FIG. 18 for surface protection, and removing the peelable core, according to some embodiments of the disclosed subject matter.

FIG. 20 is a representation of etching the plated copper-nickel-copper pattern of FIG. 12 to form BGA pockets and conductive BGA pads, according to some embodiments of the disclosed subject matter.

FIG. 21 is a representation of plating a copper-bonding organic solderability preservative on the structure of FIG. 20, according to some embodiments of the disclosed subject matter.

FIG. 22 is a representation of drilling a cavity in the BU films of the structure of FIG. 21 and placing an EMIB die into the cavity, according to some embodiments of the disclosed subject matter.

FIG. 23 is a representation of laminating a BU film to fill the cavity of FIG. 22 and drilling and plating vias into the BU film, according to some embodiments of the disclosed subject matter.

FIG. 24 is a representation of laminating SR, forming SROs, forming an FLI configuration and forming BGA pockets and conductive pads for ball assembly, according to some embodiments of the disclosed subject matter.

DETAILED DESCRIPTION

Figure 1:
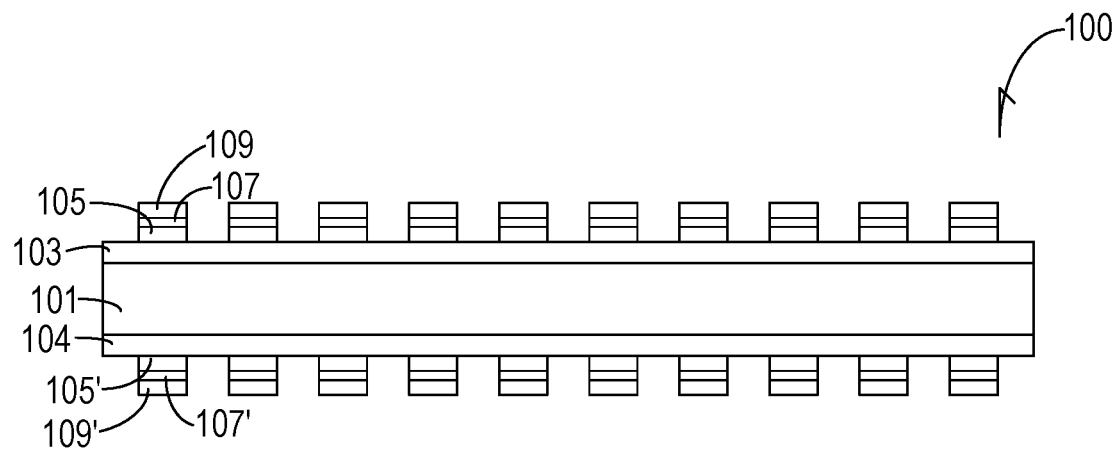
FIGS. 1-11 are diagrams of a process flow according to some embodiments of the disclosed subject matter.
Figure 2:
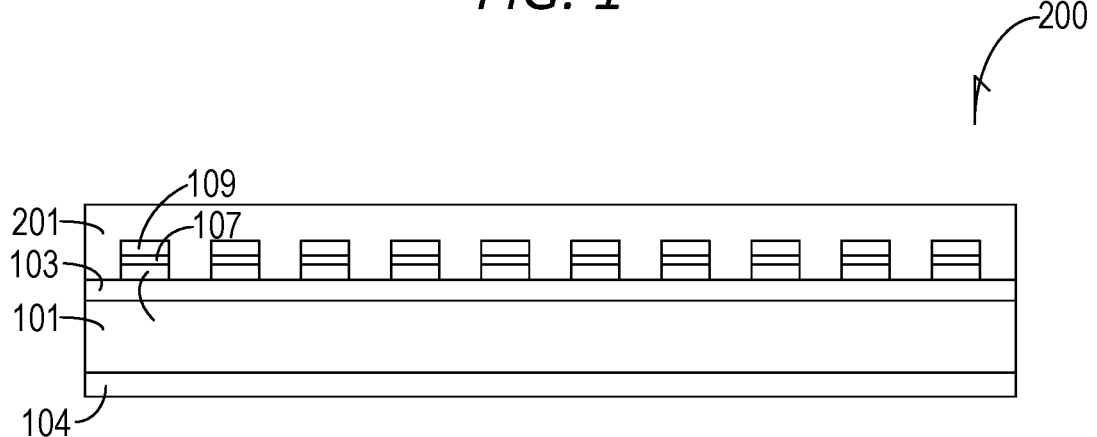

FIGS. 1-11 are diagrams of a process flow according to some embodiments of the disclosed subject matter. FIG. 1 is a representation 100 of plating a spaced pattern of a plurality of copper-nickel-copper elements, one of which is enumerated 105, 107, 109 and another of which is enumerated 105', 107', 109', on both the copper foil 103 on the front side and the copper foil 104 on the back side of a peelable core 101. Other plating materials, such as copper-titanium-copper, may be used as may meet the needs of the solution at hand. Copper-nickel-copper is often chosen because it is relatively easy to deposit and is relatively easy to etch in a subsequent step, discussed below. The spaced pattern is seen in side view in FIG. 1 but in actuality the pattern is planar and has the pattern of a ball grid array (BGA). The copper-nickel-copper plating elements such as 105, 107, 109 and 105', 107', 109' are for ultimate use later in the process for forming an array of BGA pockets and BGA pads of the coreless semiconductor package, according to some embodiments of the disclosed subject matter. In embodiments the BGA pockets will contain solder balls of the BGA, the solder balls connecting to the BGA pads for connecting the interconnection circuitry of the disclosed structure to outside the structure. Some of the pockets may also be for land side capacitors (LSC). In FIG. 1 core 101 is sometimes called a "dummy" core. The package structure is plated on both sides of the core. When the process is completed and the package structure is formed, the "dummy" core is peeled away, is depaneled, leaving two structures, one from the front side of the core and one from the back side of the core. For example, 105, 107, 109 is one of a pattern of plated elements plated on the front side of the core 101 and 105', 107' 109' is one of a pattern of plated elements plated on the back side of core 101. This is an example of the advantage of coreless packages yielding twice the product throughput in essentially the same processing time as for a conventional cored package. In the conventional core package, there can also be processing on the front side of the core and processing on the backside of the core, but because there is no core depaneling, the two sides on the core remains in one package. FIG. 2 onward will describe the process steps for one side of the core, but it is to be understood that the process can be performed at essentially the same time on both sides of the core. Only a single side is illustrated as a matter of space-saving.

FIG. 2 is a representation 200 of laminating a BU dielectric film 201, sometimes called a "green" BU film, to differentiate it from the standard translucent film, onto the plating of FIG. 1, according to some embodiments of the disclosed subject matter. A BU film may sometimes be referred to herein as a BU layer. BU films or layers described herein may be dielectric films or layers.

Figure 3:
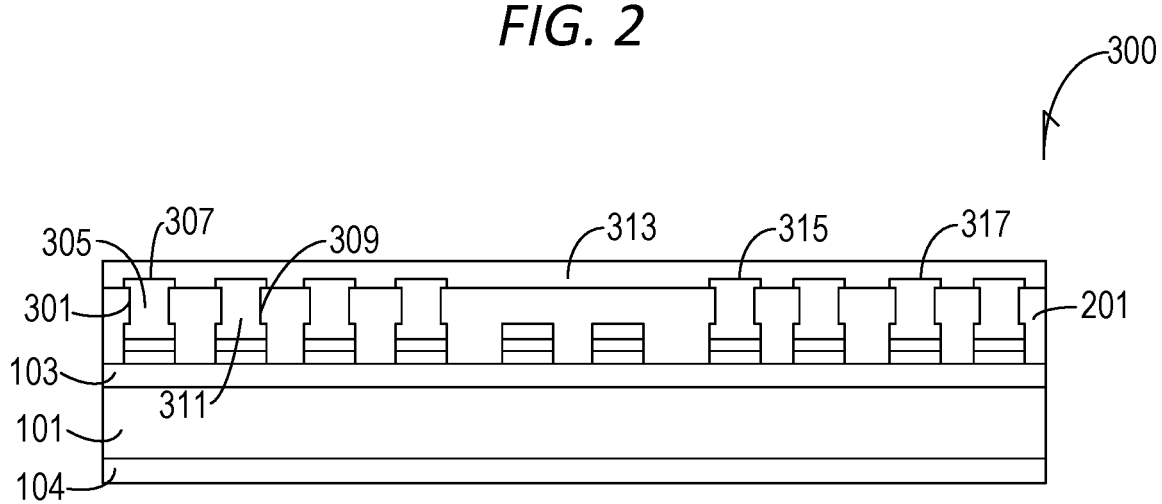

FIG. 3 is a representation 300 of drilling of vias, two of which are enumerated 301, 309, desmearing the vias, and plating the vias with copper as at 305, 311. Plating vias with copper comprises depositing copper into the drilled vias using a plating process. An additional illustrated step is plating copper interconnect patterns, some of which are enumerated 307, 315, 317 on or in the BU film 201 of FIG. 2, and laminating a subsequent dielectric BU film 313 on the copper patterns, according to some embodiments of the disclosed subject matter. In some embodiments the copper patterns may be referred to as traces, which extend into the plane of the drawing as one looks at the drawing on the page. The copper plating on or in the BU film may be done by semi-additive processes in both this step and one or more of the other plating steps of the processes disclosed herein. Other conductive elements besides copper may be used. In some embodiments tin, or a copper-tin compound, among other elements and compounds, may be used.

Figure 4:
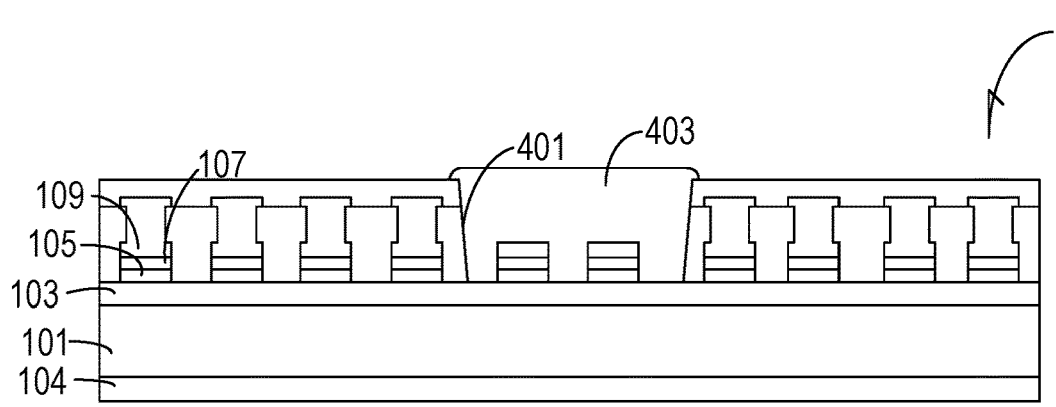

FIG. 4 is a representation 400 of drilling a cavity 401 into the BU film of the structure of FIG. 3, desmearing the cavity, and depositing magnetic material 403, which may be a magnetic resin in the cavity, according to some embodiments. In some embodiments magnetic material 403 may be deposited by a stencil printing process. The magnetic material may be cured in place, according to some embodiments of the disclosed subject matter.

Figure 5:
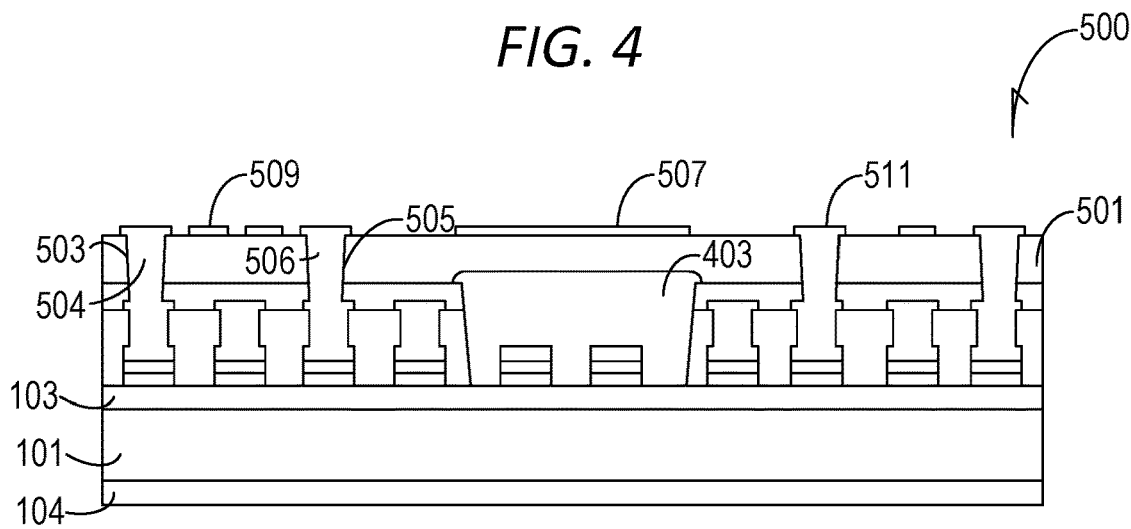

FIG. 5 is a representation 500 of laminating a BU film 501 on the structure of FIG. 4, drilling and desmearing vias, two of which are enumerated 503, 505, plating the vias with copper as at 504, 506, and plating copper traces, or interconnections, two of which are enumerated 509, 511, and plating a copper plane 507 over the magnetic material. Copper plane 507 is seen in side view as a layer 507 in FIG. 5, but in actuality copper layer 507 will be planar. Copper plane 507 may be used as a laser stop for protection of the magnetic material in subsequent processing, according to some embodiments of the disclosed subject matter.

Figure 6:
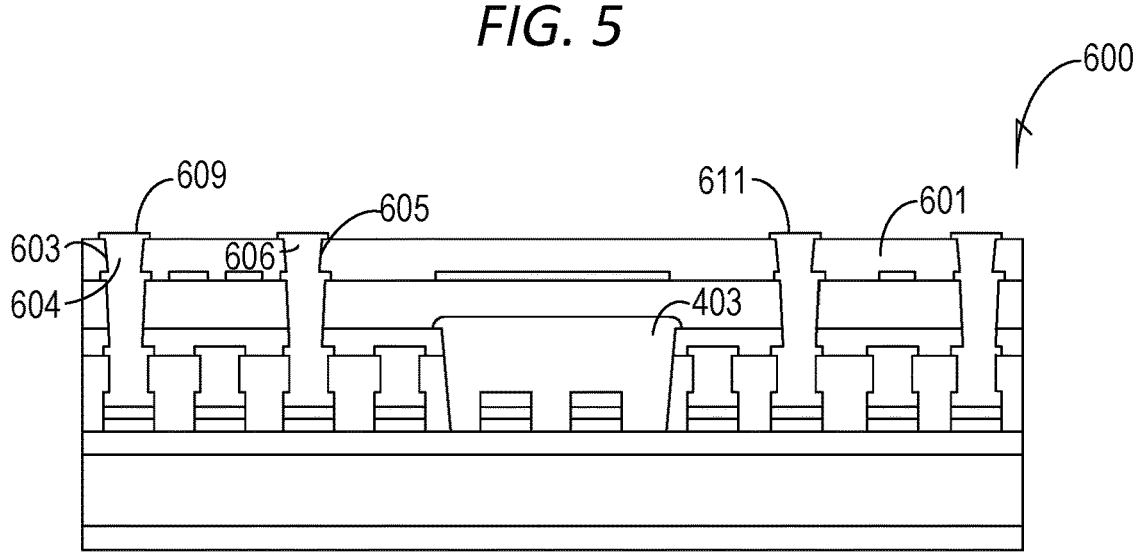

FIG. 6 is a representation 600 of laminating a BU dielectric film 601 on the structure of FIG. 5, and drilling vias, two of which are enumerated 603, 605, desmearing the vias, plating the vias with copper as at 604, 606, and plating an interconnection copper pattern, two traces of which are enumerated 609, 611, on the BU film 601, according to some embodiments of the disclosed subject matter.

Figure 7:
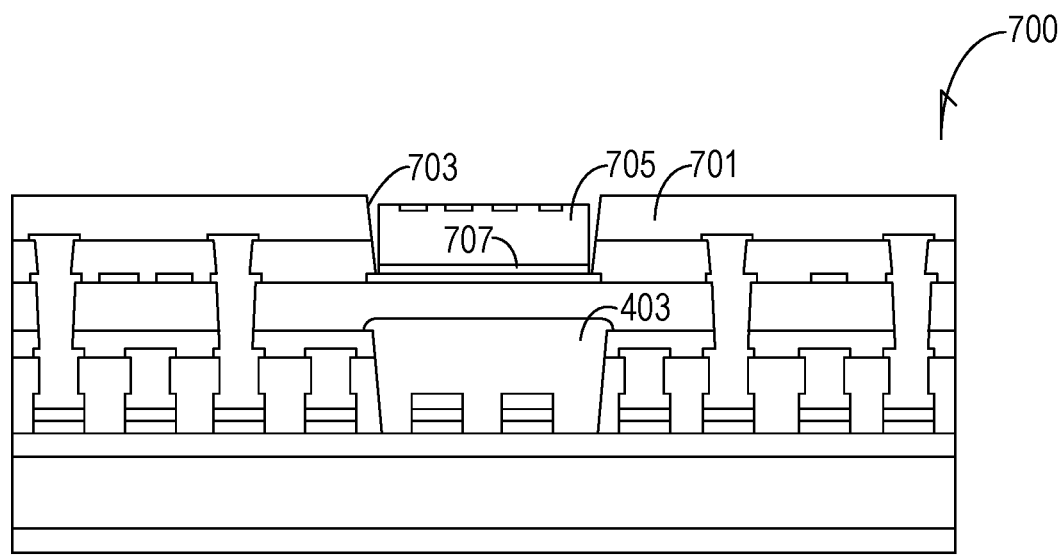

FIG. 7 is a representation 700 of forming BU film 701 on the structure of FIG. 6, drilling a cavity 703, placing an EMIB die 705 into the cavity adjacent, or above, the magnetic material 403, and curing a die bonding film 707 which generally comes with the die, according to some embodiments of the disclosed subject matter. As will be discussed below with respect to FIG. 11, this magnetic material 403 will be used with a second magnetic material 1109 to encapsulate copper traces to comprise a unified magnetic inductor.

Figure 8:
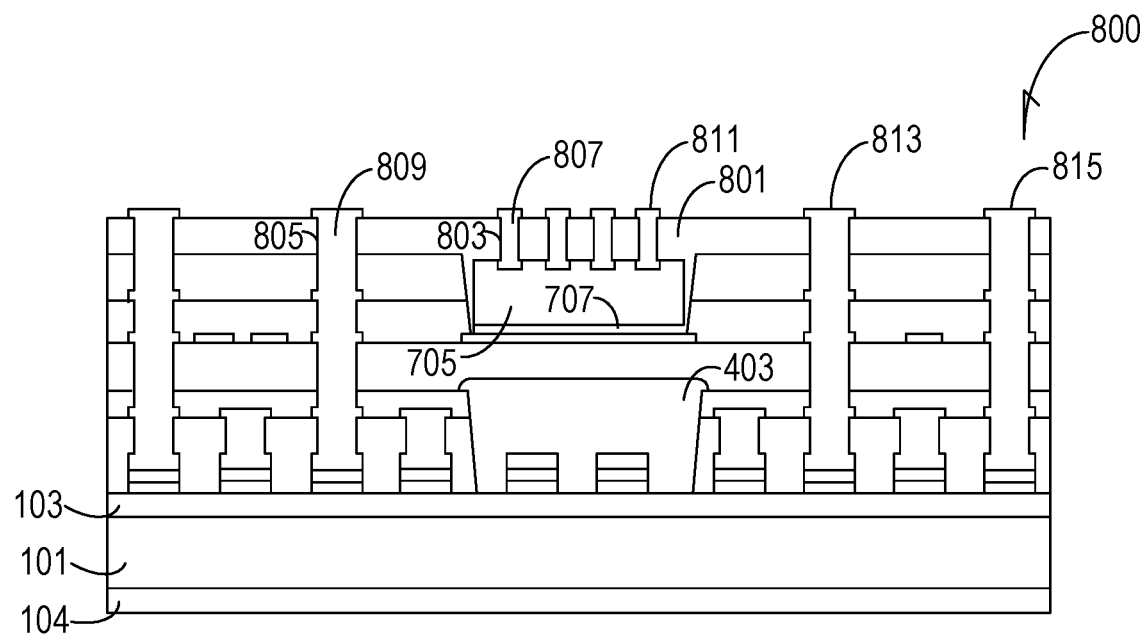

FIG. 8 is a representation 800 of laminating a BU film 801 to fill the cavity 703 of FIG. 7, drilling vias, two of which are enumerated 803, 805, desmearing the vias and plating them with copper as at 807, 809, and plating copper pads or other interconnections, three of which are enumerated 811, 813, 815 according to some embodiments of the disclosed subject matter. Tin may also be used. The vias and interconnections can connect the dies of the EMIB to other circuitry within the structure, or outside the structure, by way of solder balls to be placed in BGA pockets to connect with conductive BGA pads that are discussed below.

Figure 9:
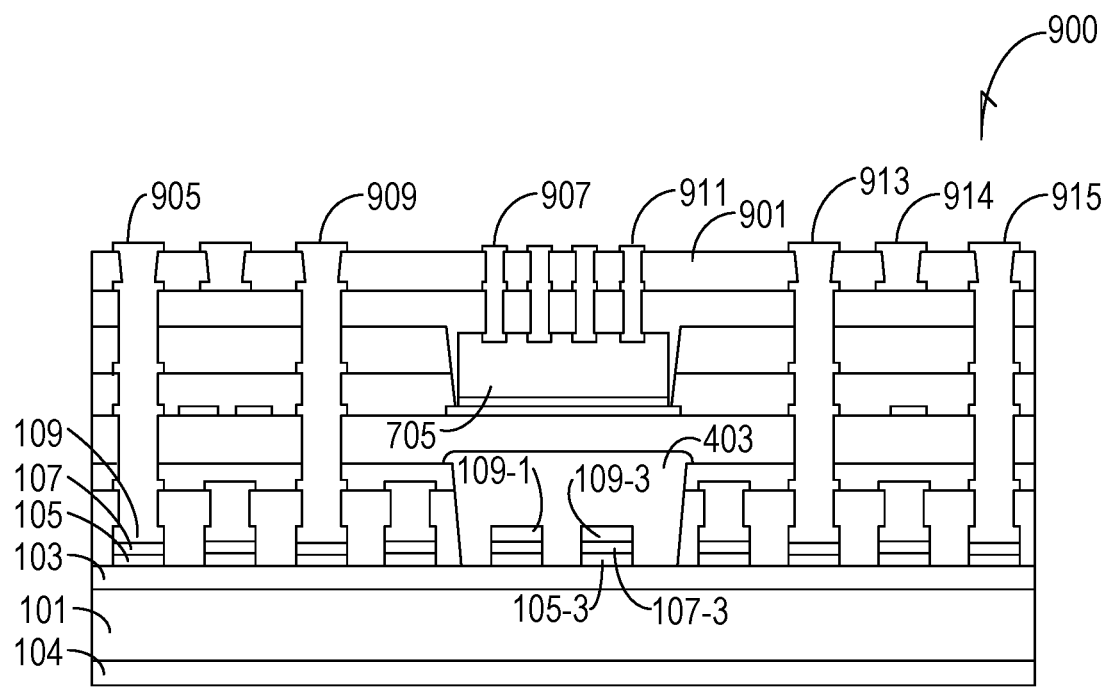
Figure 10:
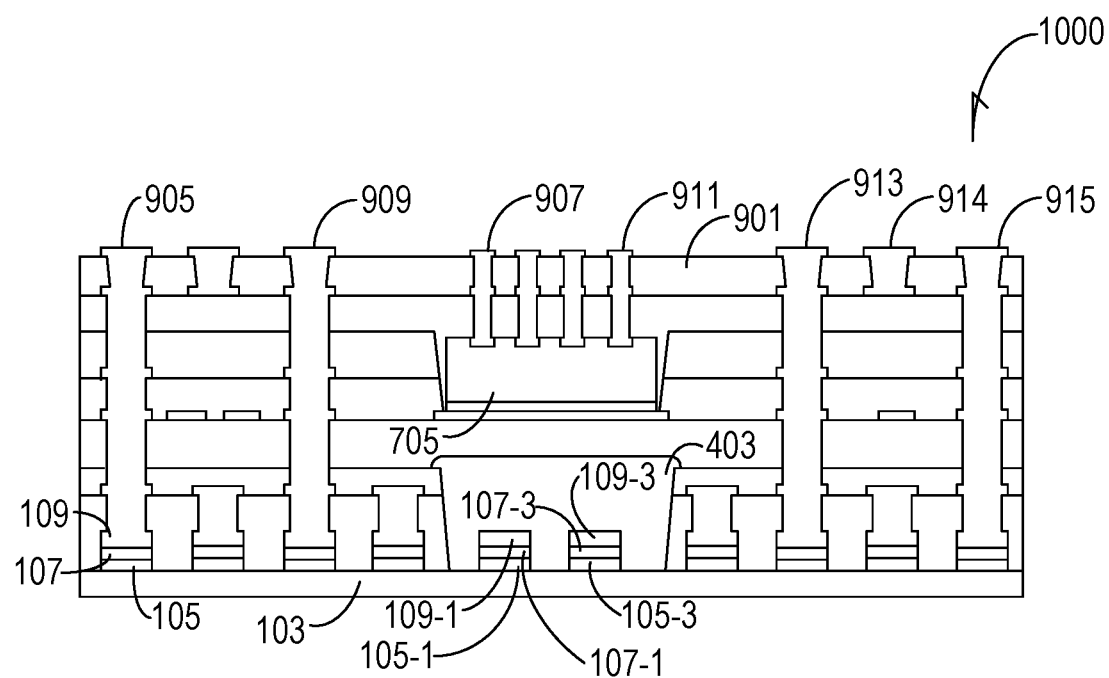

FIG. 9 is a representation 900 of laminating solder resist (SR) layer 901 onto the structure of FIG. 8 and forming solder resist openings (SROs), which process may be done by well-known photo imaging processes. An FLI, some of the traces (or pads) of which are enumerated 905, 907, 909, 911, 913, 914, 915, may be plated into the SROs, according to some embodiments of the disclosed subject matter. The FLI is configured to connect to some or all of the interconnections discussed with respect to FIG. 8. Generally, a number of types of metals usable for FLI are available. Examples include copper, copper-nickel-palladium gold, copper-nickel-gold, or copper-tin, and others, as may be appropriate for the particular solution at hand. Magnetic material 403, first seen in FIG. 4, is illustrated, as are two sets of copper-nickel-copper plating 105-1, 107-1, 109-1 and 105-3, 107-3, 109-3 that are adjacent magnetic material 403, the latter two sets ultimately used for forming the full inductor as discussed below, for some embodiments. These two sets are part of the ten copper-nickel-copper plating elements respectively illustrated above copper foil 103 of FIG. 1, according to some embodiments of the disclosed subject matter. Ten copper-nickel-copper elements are shown for illustrative purposes. In practice there will usually be many more than ten in the BGA pattern, FIG. 10 is a representation 1000 of depaneling the peelable core 101 first seen in FIG. 1 and also illustrated in FIG. 9, leaving copper foil 103, and the copper-nickel-copper plating. One of the copper-nickel-copper layers is enumerated 105, 107, and 109, originally seen in FIG. 1. Another two sets are enumerated 105-1, 107-1, 109-1 and 105-3, 107-3, 109-3, originally seen in FIG. 9.

Figure 11:
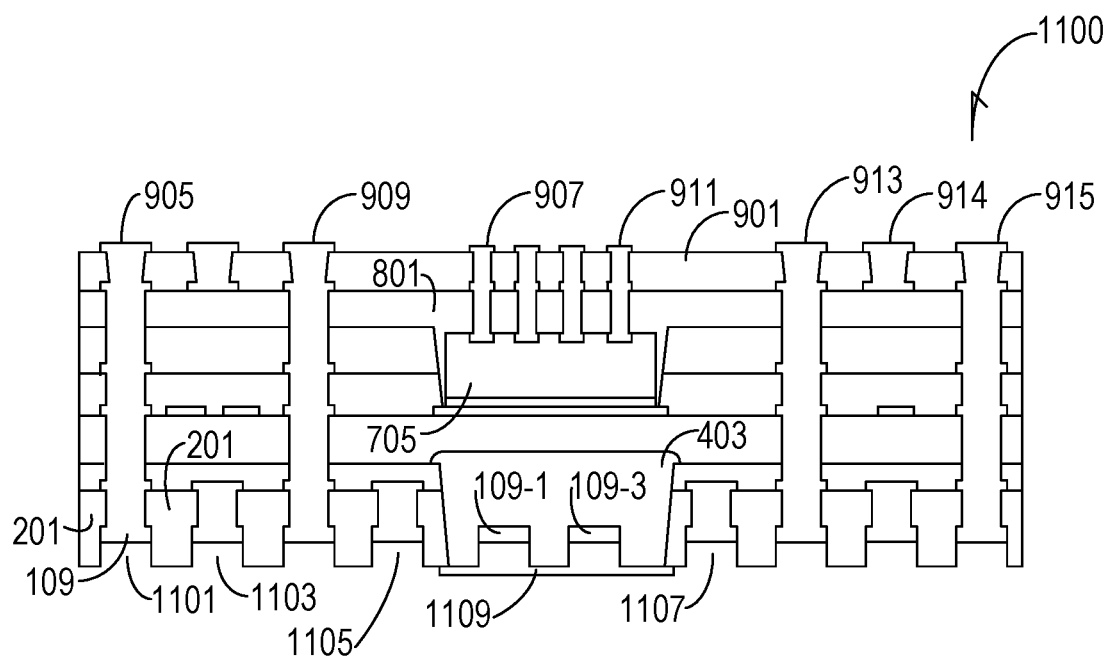

FIG. 11 is a representation 1100 of etching the copper foil 103 and etching the copper-nickel layers such as 105, 107 of FIG. 1, leaving at least part of the copper layer, which is enumerated 109, first seen in FIG. 1, to create BGA pockets which will ultimately contain solder balls or LSC capacitors as discussed above. Four of the BGA pockets are enumerated 1101, 1103, 1005, and 1007. Two copper plated elements 109-1, 109-3 which are adjacent magnetic material 403 are not BGA pockets but instead are the copper traces, or pads, that form part of the full inductor. To complete the full inductor, copper elements 109-1, 109-3 will be enveloped with a magnetic material 1109, in some embodiments, resulting in the copper traces being fully encapsulated by magnetic material 403, 1109, which may be different types of magnetic material. The magnetic materials differ in the types of resins used and may include, in some embodiments, epoxy anhydrite, bisphenol epoxies or phenolic epoxies. An assembly process will print, or otherwise deposit, magnetic material such as magnetic ink or magnetic paste on the back side to encapsulate the copper traces 109-1, 109-3 completely within magnetic material, resulting in an inductor, according to some embodiments of the disclosed subject matter. The copper traces 109-1, 109-3 encapsulated in magnetic material 403, 1109 can be viewed as analogous, in a large scale sense, to a copper wire wound around a coil. The magnetic material 1109 will be a stand-off compared to the rest of the structure, as illustrated. In some embodiments the stand-off may be 20 um or more. A copper-bonding organic solderablity preservative may be deposited on the exposed BGA pads, one of which is enumerated 109, for ball assembly. In some embodiments an assembly process will add solder balls in some or all of the BGA pockets in the BGA pattern originally discussed with respect to FIG. 1. In other of the pockets, LSCs may be attached.

FIGS. 12-24 are diagrams of a process flow according to another embodiment of the disclosed subject matter. Semiconductor packages such as those under discussion are generally manufactured in a so-called giant panel formed in part on a peelable core. The panel is then singulated to produce the partially completed coreless packages, according to some embodiments of the disclosed subject matter. Final assembly processes on the partially completed coreless packages, which processes in some embodiments include forming an inductor to complete the coreless semiconductor package, may be employed. However, due to space limitations, the drawings describe a single package, it being understood that in practice a large panel of such packages will be formed and, in some embodiments, singulated, and then go into additional assembly processes as indicated above.

Figure 12:
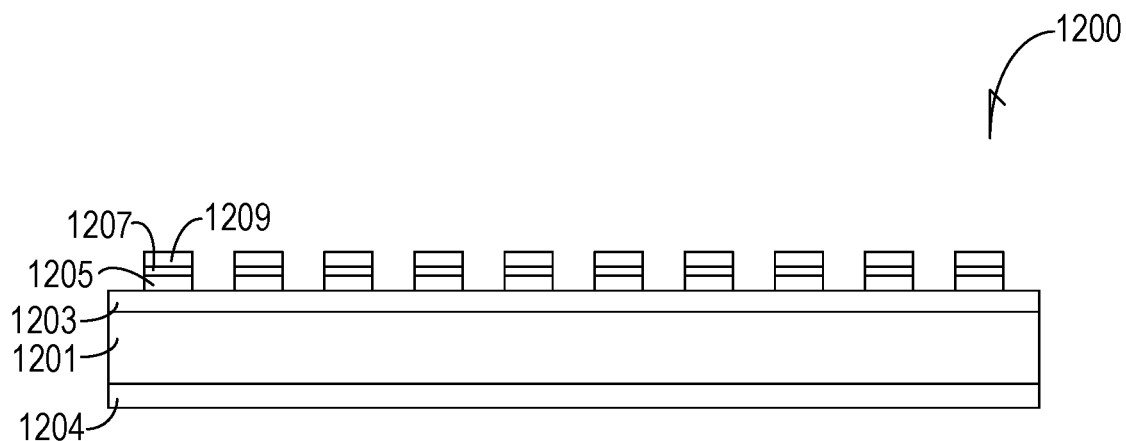
FIGS. 12-24 are diagrams of a process flow according to other embodiments of the disclosed subject matter.

FIGS. 12-17 illustrate essentially the process steps of FIGS. 1-6. FIG. 12 is a representation 1200 of plating a copper-nickel-copper pattern, one element of which is enumerated 1205, 1207, 1209, on a copper foil 1203 of a peelable core 1201. Other plating materials may be used as may meet the needs of the solution at hand. Peelable core 1201 has copper foils 1203, 1204 on both sides of the core and the copper-nickel-copper plating is on the copper foils 1203, 1204, on both sides of core 1201. The copper-nickel-copper plating is for ultimate use later in the process for forming ball grid array (BGA) pockets and conductive BGA pads of the coreless semiconductor package, according to some embodiments of the disclosed subject matter.

Figure 13:
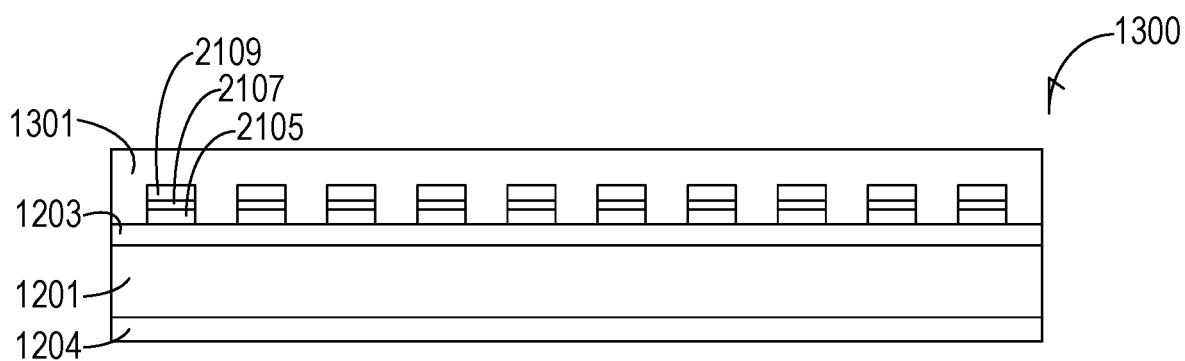

FIG. 13 is a representation 1300 of laminating a buildup (BU) dielectric film 1301 onto the structure of FIG. 12. This BU file may be a "green" BU film, to differentiate it from the standard translucent film, according to some embodiments of the disclosed subject matter.

Figure 14:
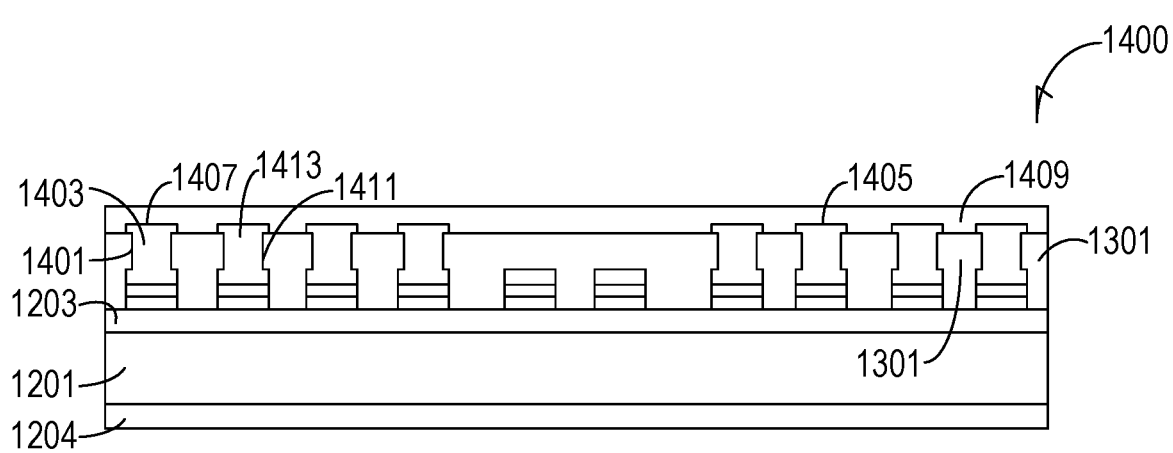

FIG. 14 is a representation 1400 of drilling of vias, two of which are enumerated 1401, 1411, desmearing and plating the vias with copper as at 1403, 1413, and plating copper patterns, two of which are illustrated as interconnections 1405, 1407, on or in the BU film 1301 of FIG. 13. A subsequent dielectric BU film 1409 is laminated on the copper patterns, according to some embodiments of the disclosed subject matter. In some embodiments the copper patterns may be referred to as traces, which extend into the plane of the drawing as one looks at the drawing on the page. The copper plating on or in the BU film 1301 may be done by a semi-additive process.

Figure 15:
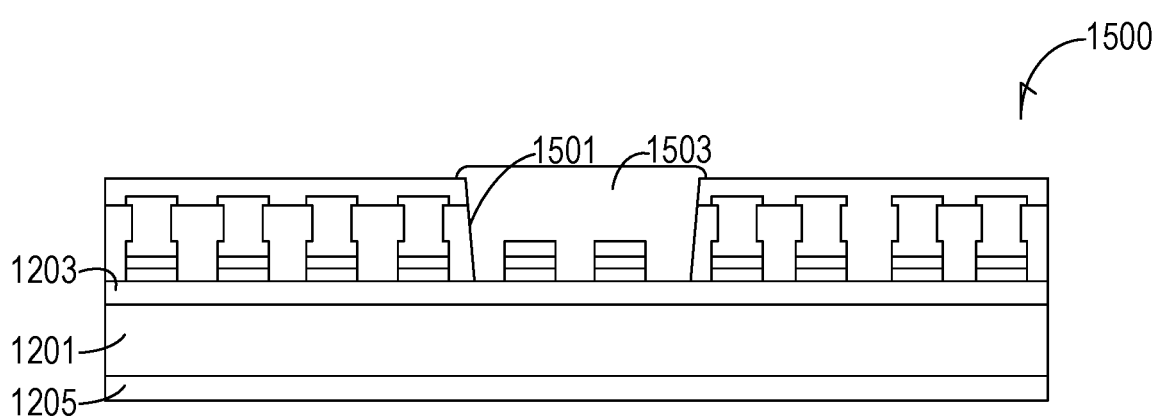

FIG. 15 is a representation 1500 of drilling a cavity 1501 into the BU film 1409 of the structure of FIG. 14 and depositing magnetic material 1503, for example by printing, which magnetic material may be a magnetic resin in some embodiments, into the cavity. The magnetic material 1503 may be cured in place, according to some embodiments of the disclosed subject matter.

Figure 16:
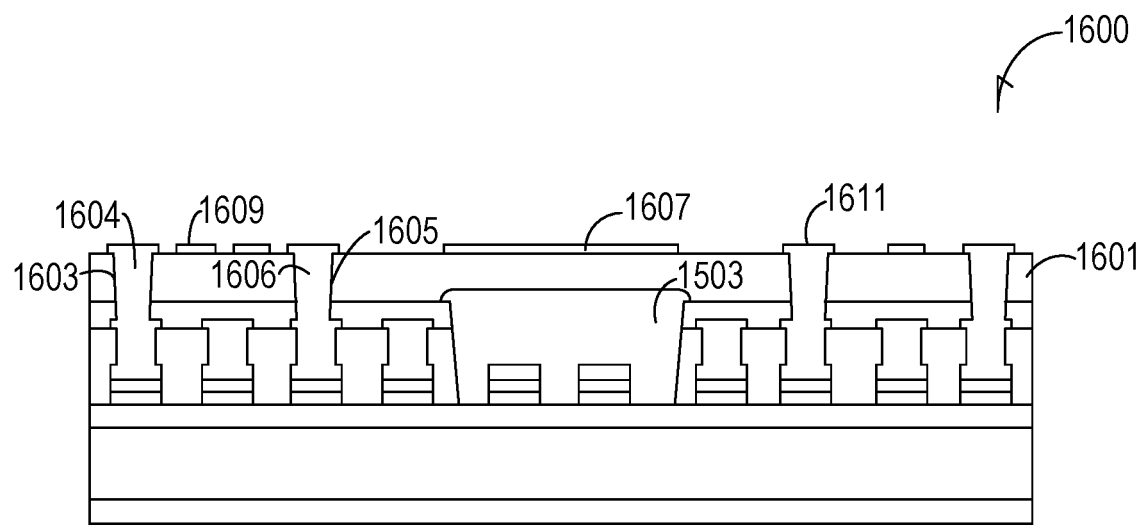

FIG. 16 a representation 1600 of laminating a BU film 1601 on the structure of FIG. 15, drilling and desmearing vias, two of which are enumerated 1603, 1605, plating the vias with copper as at 1604, 1606, plating copper traces two of which are enumerated 1609, 1611, and plating a copper layer 1607, seen in side view in FIG. 16. Copper layer 1607 may be used as a laser stop for subsequent processing, according to some embodiments of the disclosed subject matter.

Figure 17:
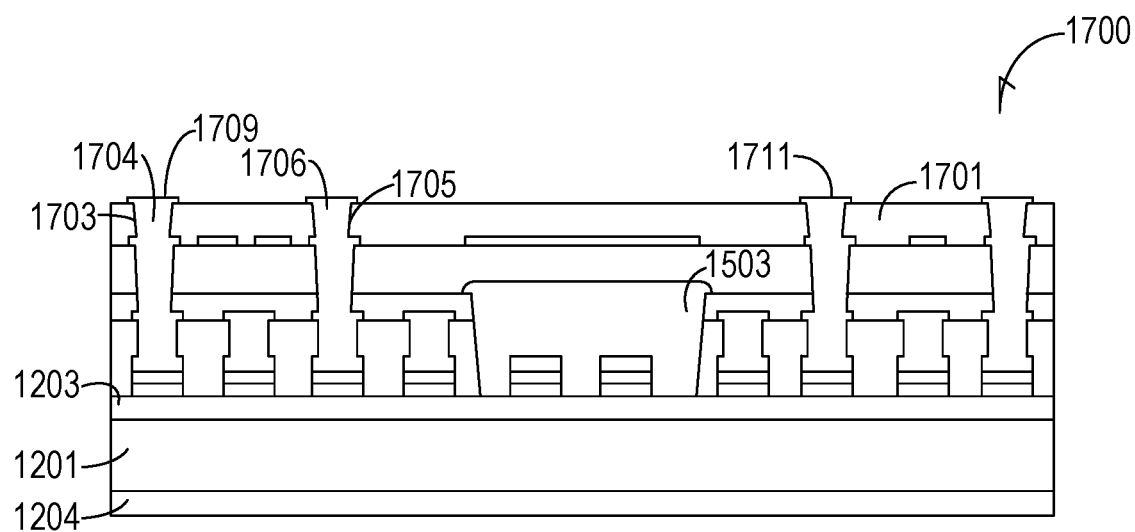

FIG. 17 is a representation 1700 of laminating a BU dielectric film 1701 on the structure of FIG. 16, and drilling vias, two of which are enumerated 1703, 1705, desmearing the vias, plating the vias with copper as at 1704, 1706, and plating a copper pattern, two traces of which are enumerated 1709, 1711, on the BU film 1701, according to some embodiments of the disclosed subject matter.

Figure 18:
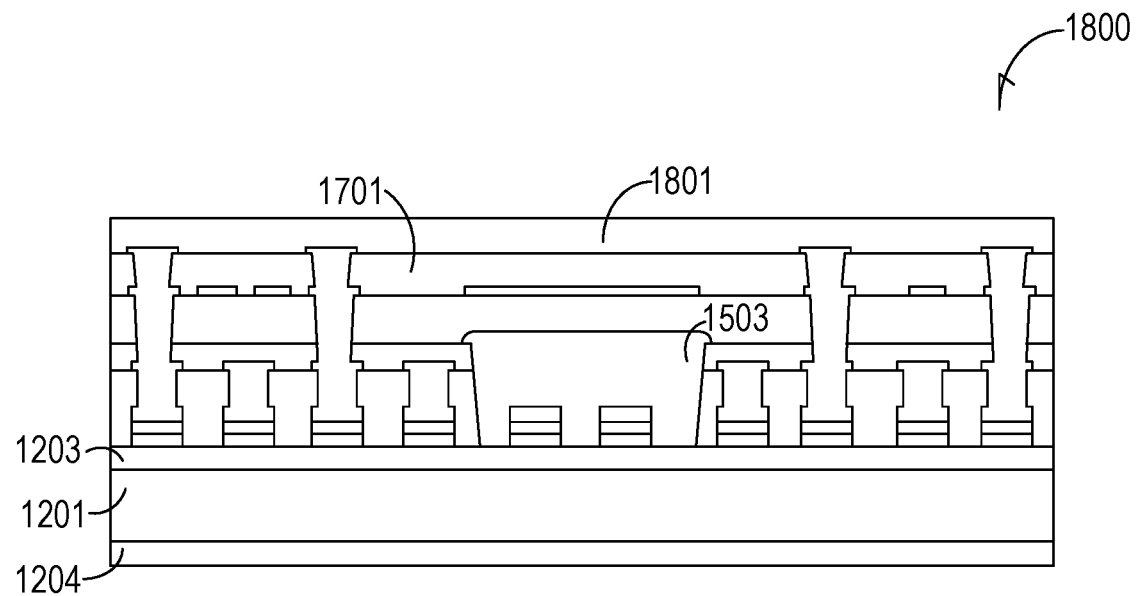

FIG. 18 is a representation 1800 of laminating a BU dielectric layer 1801 onto the structure of FIG. 17, according to some embodiments of the disclosed subject matter. In the described embodiment there are two BU layers, 1801, and 1701, which is one differentiator of process 2 from process 1, as discussed below. However, a differentiator of process 2 from process 1 could comprise a number of layers that is more than the two layers 1801, 1701.

Figure 19:
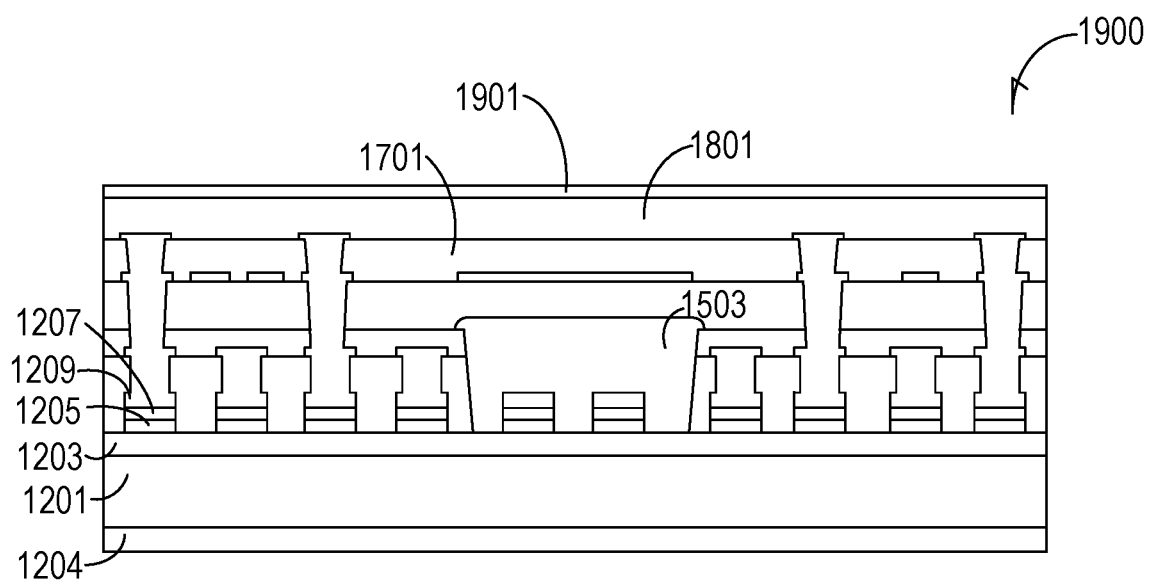

FIG. 19 is a representation 1900 of adding a polymer film, such as polyethylene tetrafluoride (PET) film 1901 to the top side of the structure of FIG. 18, in some embodiments on the plurality of BU layers 1801, 1701 and 1601, for surface protection during chemical processing to the backside of the structure, which follows in the discussion below. At this step in process 1, illustrated in FIG. 7, a cavity had been drilled and an EMIB placed in the cavity. However, in this step in process 2, illustrated in FIG. 19, a PET film is placed on the topside of the structure before drilling the cavity for the EMIB, as discussed further below. After this step in FIG. 19, the peelable, or dummy, core, 2101, seen originally in FIG. 12 in the process under discussion, can be removed, leaving cooper foil 1203, first seen in FIG. 12, according to some embodiments of the disclosed subject matter.

Figure 20:
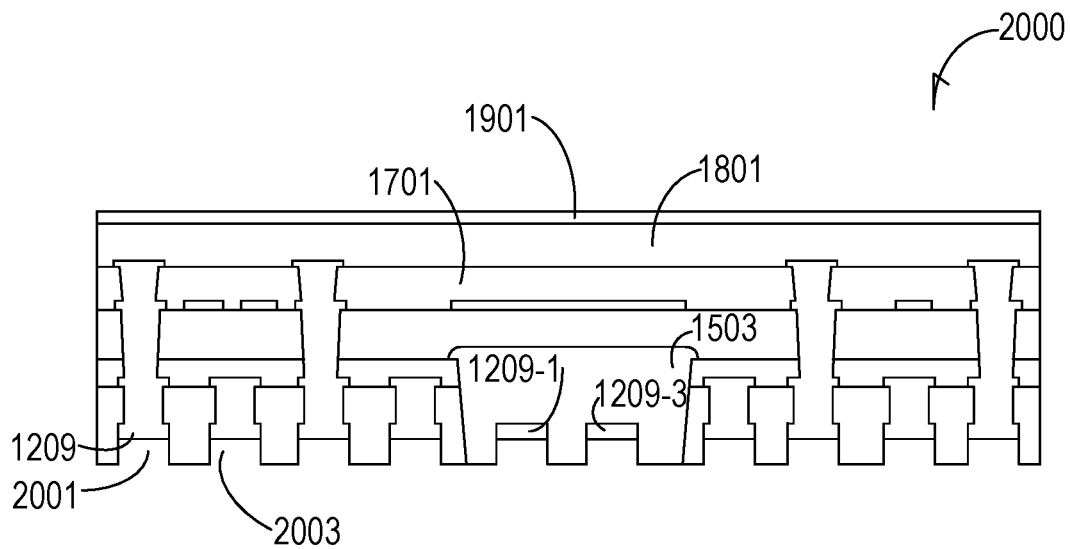

FIG. 20 is a representation 2000 of the structure of FIG. 19 with the core removed. Copper foil 1203, seen in FIG. 19 is etched away much the same as was discussed above with respect to copper foil 103 in FIG. 10. Etching the plated copper-nickel 1205, 1207 originally seen in FIG. 12 can then take place to form BGA pockets, two of which are enumerated 2001, 2003, and leaving BGA copper pads, one of which is enumerated 1209 and two of which, adjacent magnetic material; 1503, are enumerated 1209-1 and 1201-3. Each copper pad, such as 1209, 1209-1 and 1201-3 is part of the original copper-nickel-copper BGA pattern illustrated as copper-nickel-copper elements, one of which elements is enumerated 1205, 1207, 1209 in FIG. 12, according to some embodiments of the disclosed subject matter.

Figure 21:
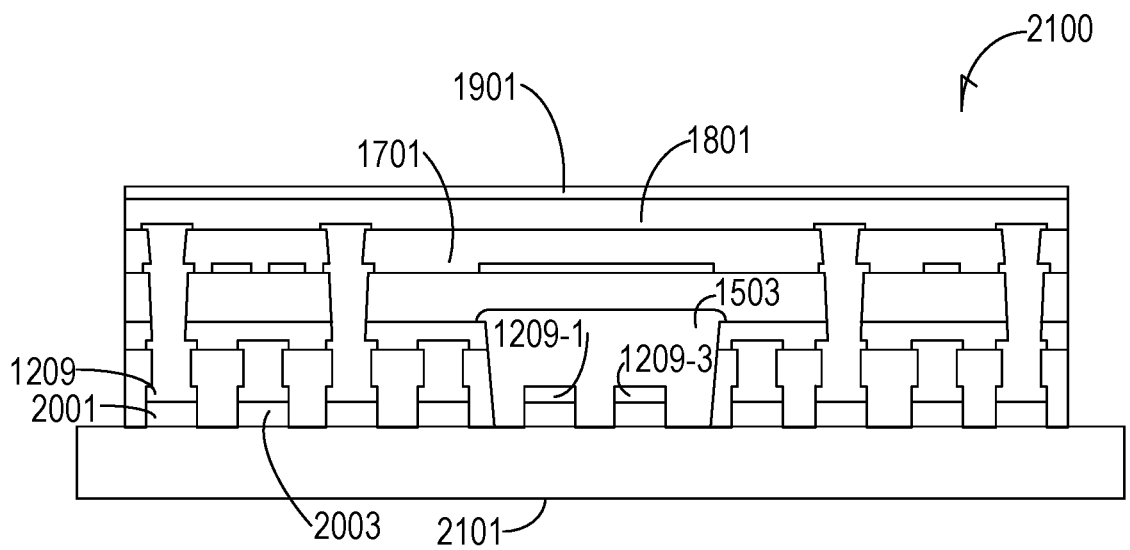

In FIG. 21 a copper-bonding organic solderability preservative (OSP) surface finish may be added to the structure of FIG. 20, to protect the copper pads, according to some embodiments. Three of the copper pads are enumerated 1209, 1209-1, according to some embodiments of the disclosed subject matter. There are various well-known types of OSP that may be used. Carrier 2101 may then be attached to the BGA side of the structure. The PET film 1901 may be removed from the top side of the structure of FIG. 21 after etching is completed and the film has served its purpose of protecting the BU film on the top side from acids from the OSP process and acids from any other of the process steps.

Figure 22:
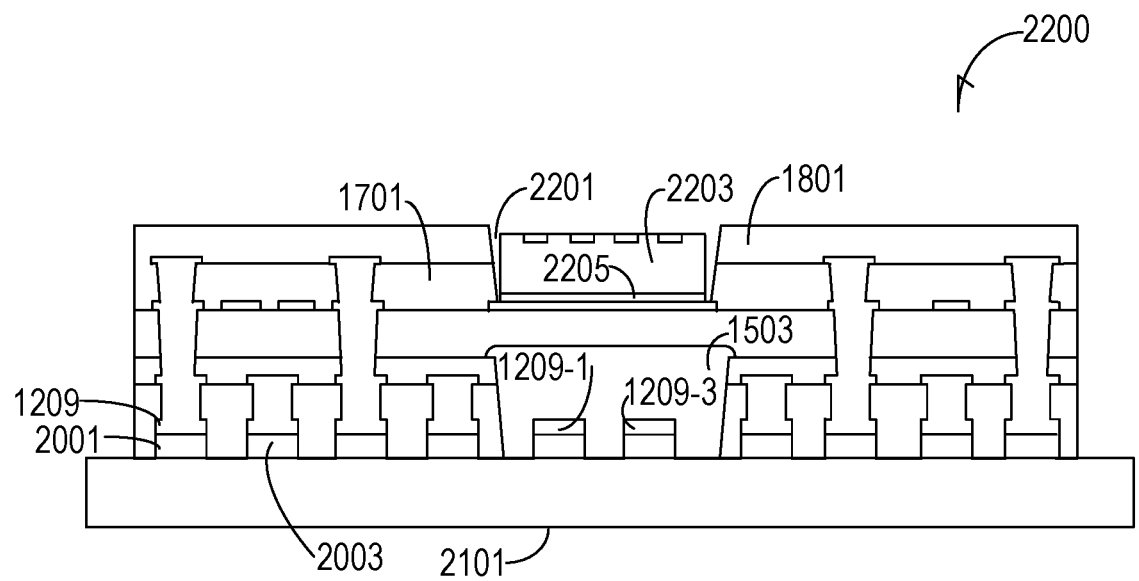

FIG. 22 is a representation 2200 of drilling a cavity 2201 in BU films 1701, 1801 of the structure of FIG. 21, desmearing the cavity, embedding EMIB die 2203 into the cavity and curing the die bonding film 2205 which generally comes with the die, according to some embodiments of the disclosed subject matter.

Figure 23:
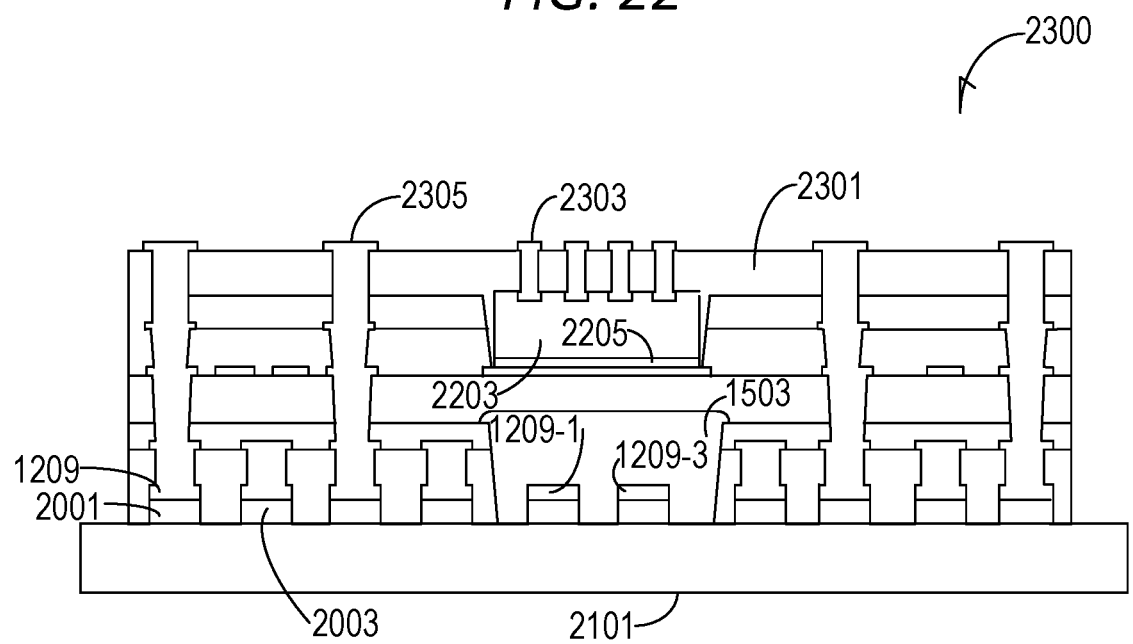

FIG. 23 is a representation 2300 of laminating a BU film 2301 to fill the cavity of FIG. 22 and drilling, desmearing and plating vias into the BU film as in previous steps, and plating trace patterns, two of which are enumerated 2303, 2305, according to some embodiments of the disclosed subject matter.

Figure 24:
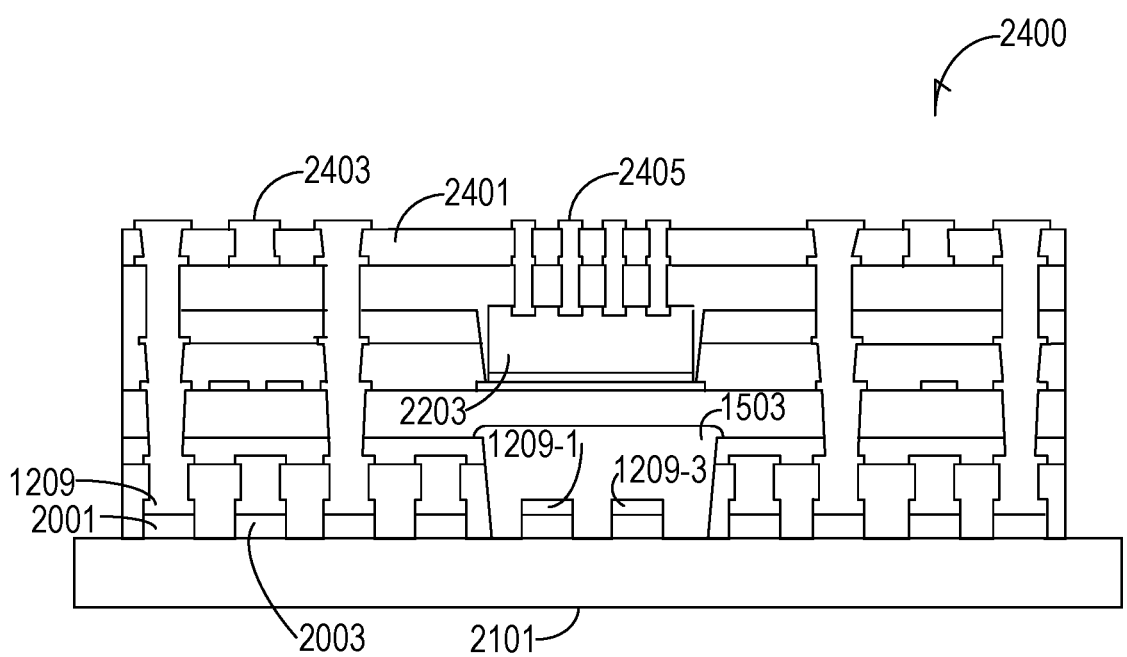

FIG. 24 is a representation 2400 of laminating and exposing solder resist layer 2401, forming solder resist openings, and forming an FLI configuration, two traces of which are enumerated 2403, 2405, in the solder resist openings. As discussed above, substrates such as that illustrated in FIG. 24 are generally manufactured in a so-called giant panel. The panel is then singulated, with the carrier 2101 in place, to produce the desired substrates for die attachment, according to some embodiments of the disclosed subject matter. The carrier 2101 may then be detached. The copper traces 1209-1, 1209-3 may be enveloped by a second magnetic material in subsequent processes to form a full inductor, such as the full inductor 1403, 109-1, 109-3, 1109 explained with respect to FIG. 11. In some embodiments, singulated units would enter an assembly process and the second magnetic material would be deposited to complete the encapsulation, such that the completed package would be essentially the same as that seen in FIG. 11.

Figure 25:
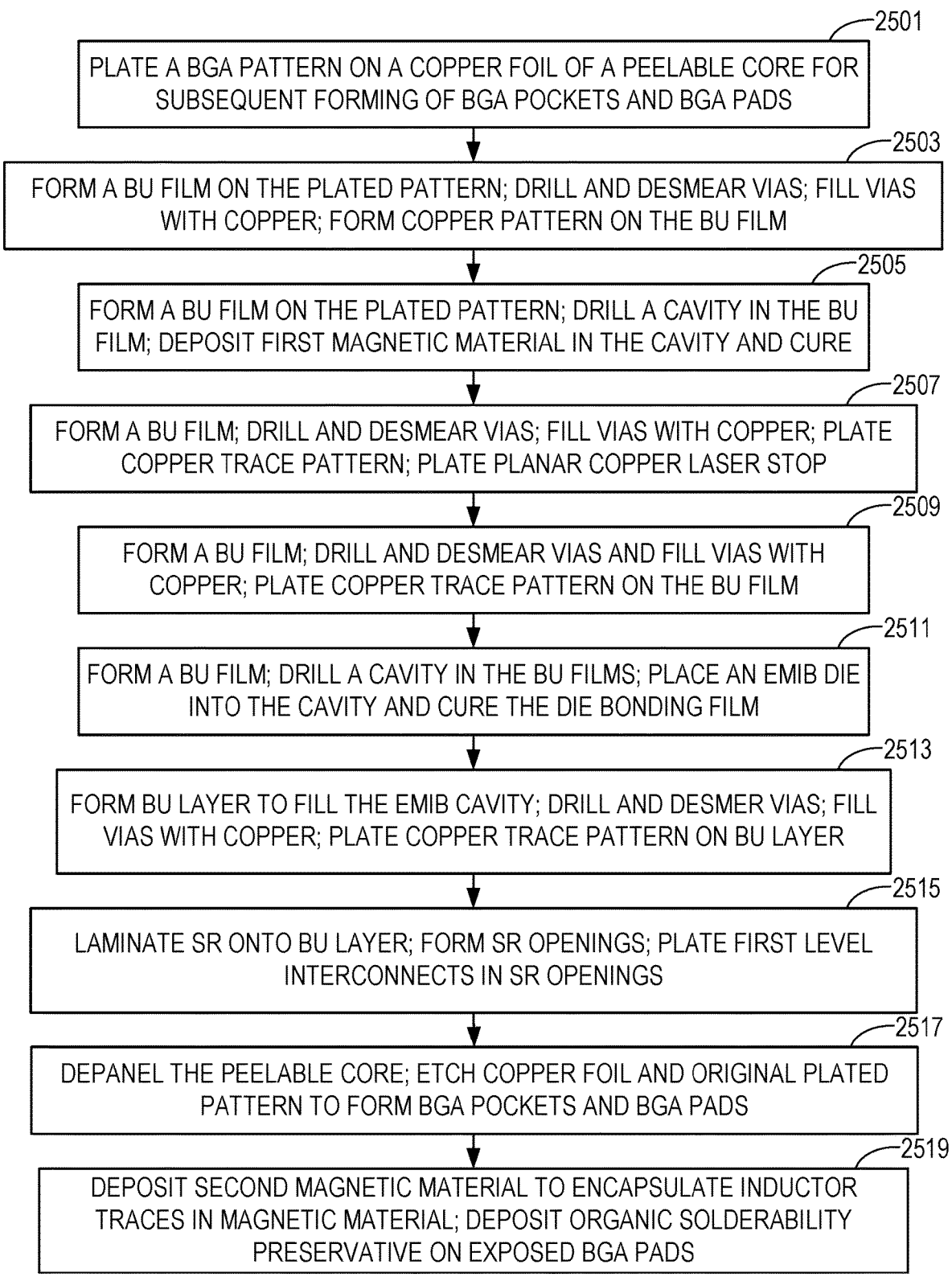
FIG. 25 is a flowchart describing a process flow, according to some embodiments of the disclosed subject matter.
Figure 26:
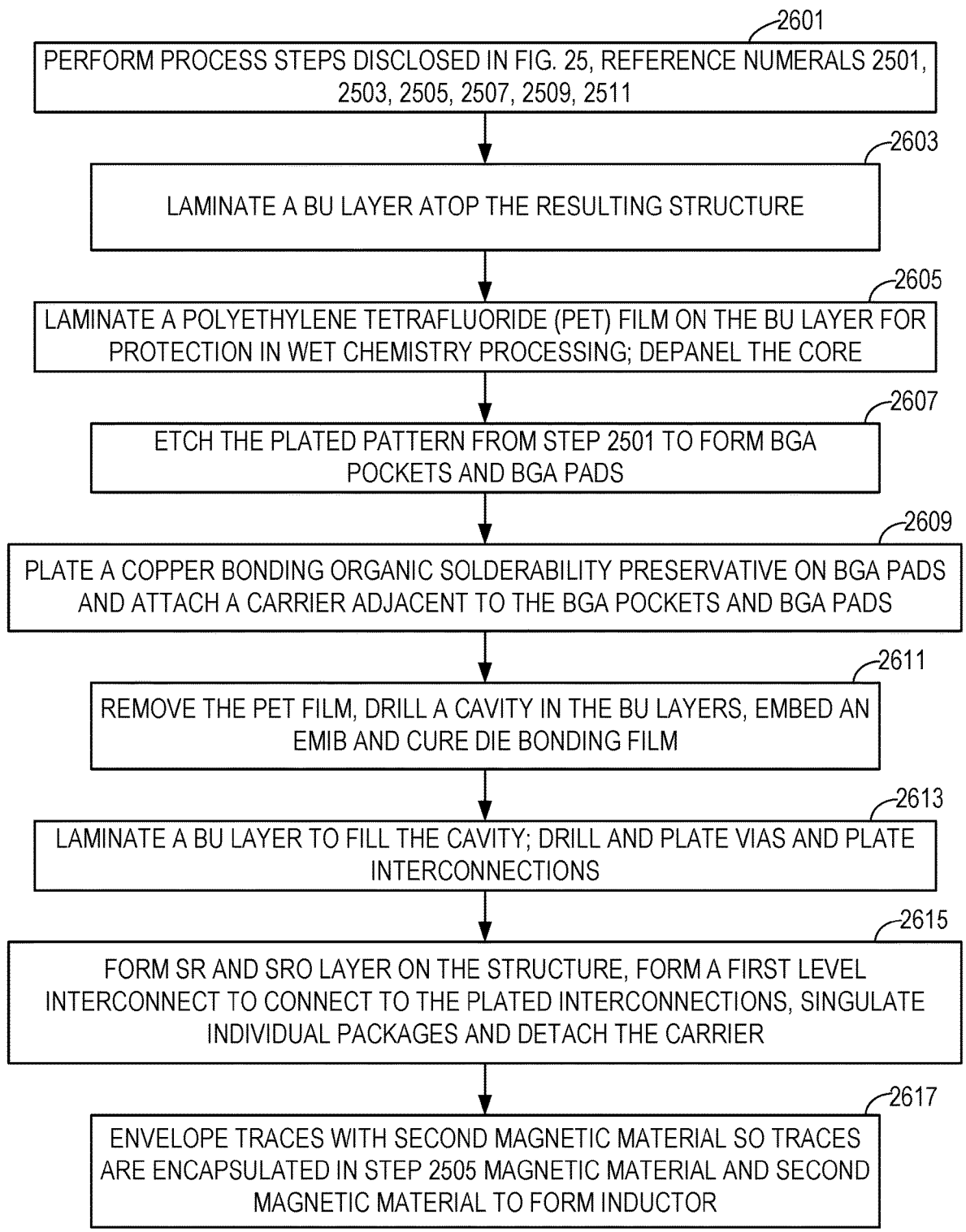
FIG. 26 is a flowchart describing a process flow, according to other embodiments of the disclosed subject matter.

FIG. 25 is a flowchart describing a process flow, according to some embodiments of the disclosed subject matter. At 2501 a BGA pattern is plated on a copper foil of a peelable core for subsequent forming of BGA pockets and BGA pads. At 2503 a BU film is formed on the plated pattern. Vias are drilled and desmeared and filled with copper. A copper interconnect pattern is formed on the BU film. At 2505 a BU film is formed on the plated pattern and a cavity is drilled in the BU film. A first magnetic material is deposited in the cavity and cured. At 2507 a BU film is formed to fill the cavity, and vias are drilled, desmeared and plated with copper. A copper trace pattern is formed on the BU film. and a planar copper laser stop is plated on the BU film over the magnetic material to protect the BU film and magnetic layer from etching processes. At 2509 a BU film is formed over the laser stop, vias are drilled desmeared and copper plated and a copper trace pattern is plated on the BU film. At 2511 a cavity is drilled in the BU films and an EMIB die is placed into the cavity. The die bonding film of the EMIB is cured. At 2513 a BU layer is formed to fill the EMIB cavity, vias are drilled, desmeared and copper plated, and a copper trace pattern is plated on the BU layer. At 2515 solder resist (SR) is laminated onto the BU layer, SR openings are formed, and first level interconnects are plated. At 2517 the peelable core is depaneled, the copper foil is etched away, and the original plated BGA pattern is etched to form BGA pockets and BGA pads. At 2519 a second magnetic material is deposited, in some embodiments by printing a magnetic paste, to envelope inductor traces, The inductor traces are thereby encapsulated by the first magnetic material and the second magnetic material to form an inductor. A copper-bonding organic solderability preservative may be formed on exposed BGA pads.

At 2601 the process steps 2501, 2503, 2505, 2507, 2509 and 2511 disclosed in FIG. 25 are performed, forming a partly completed coreless semiconductor package. At 2603, a BU layer is laminated atop the partly completed coreless semiconductor package. At 2605, a polymer film such as polyethylene tetraflouride (PET) film is laminated onto the BU layer for protection during wet chemistry processing, and the core is depaneled. At 2607 the copper foil remaining from the core may be etched away and the plated pattern seen in step 2501 may be etched to form BGA pockets and BGA pads. At 2609 a copper bonding organic solderability preservative may be plated on the BGA pads and a carrier may be attached adjacent to the BGA pockets and BGA pads. At 2611 the PET film is removed, a cavity is drilled in the BU layers, an EMIB is embedded in the cavity and the EMIB die bonding film is cured. At 2613, a BU layer is laminated to fill the cavity, vias are drilled and plated and interconnections are plated. At 2615, a solder resist layer is formed on the structure, a first level interconnect is formed to connect to the plated interconnections, individual packages are singulated and the carrier detached. At 2617 inductor traces are enveloped by a second magnetic material such that the traces are encapsulated by the first magnetic material and the second material to form an inductor.

Figure 27:
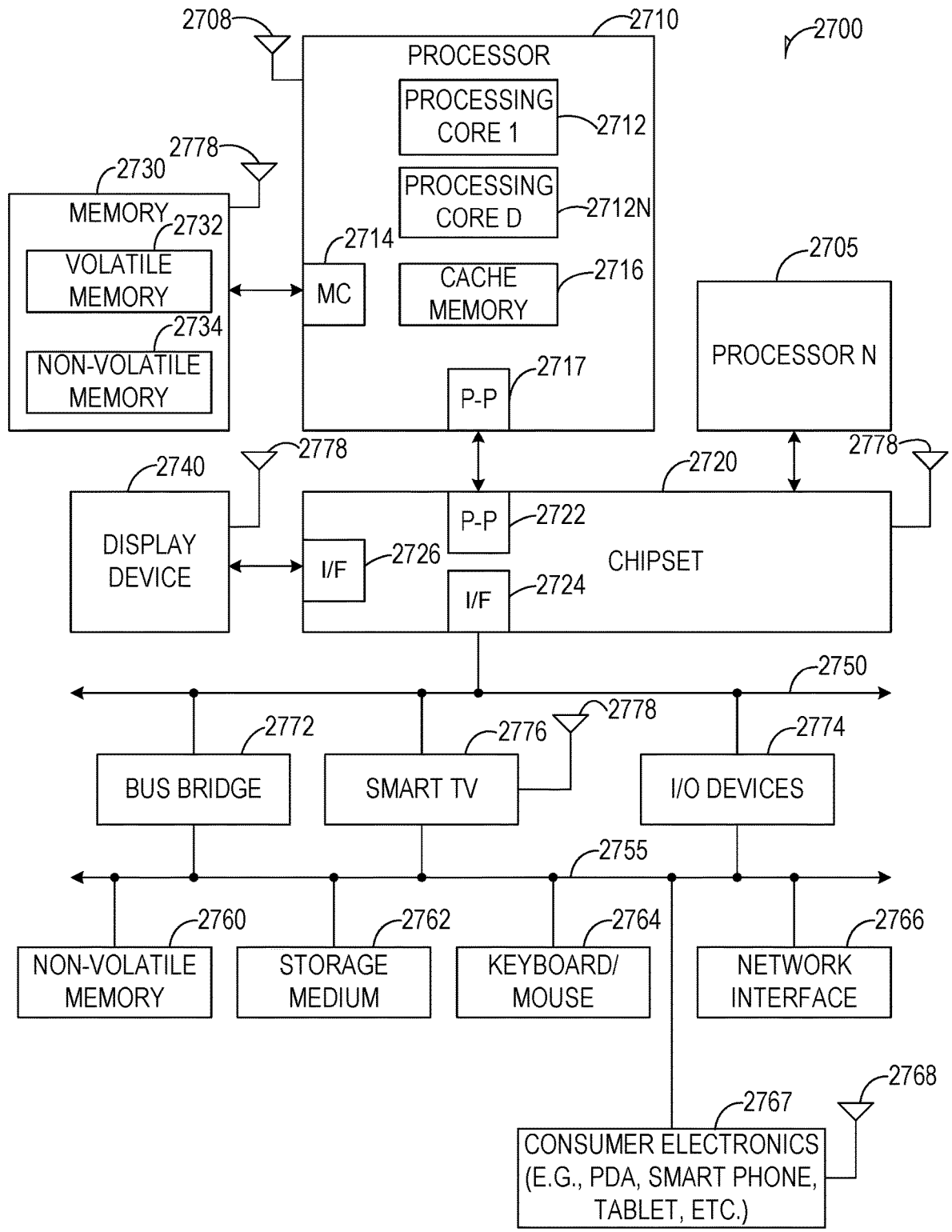
FIG. 27 is a block diagram of an example machine with which any one or more of the techniques or methodologies discussed herein may be performed, or in which apparatus or components discussed herein may be incorporated or used, according to some embodiments of the disclosed subject matter.

FIG. 27 is a block diagram of an example machine upon which any one or more of the techniques or methodologies discussed herein may be performed, or in which apparatus or components discussed herein may be incorporated or used, according to some embodiments of the present disclosure. FIG. 27 is included to show an example of a higher level device application for integrated circuits employing embedded magnetic inductors described herein. In one embodiment, system 2700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 2700 is a system on a chip (SOC) system.

In one embodiment, an electronic device which, in some embodiments may be processor 2710, has one or more processor cores 2712 and 2712N, where 2712N represents the Nth processor core inside processor 2710 where N is a positive integer. In one embodiment, system 2700 includes multiple processors including 2710 and 2705, where processor 2705 has logic similar or identical to the logic of processor 2710. In some embodiments, processing core 2712 includes, but is not limited to, pre-fetch logic to fetch instructions, decode logic to decode the instructions, execution logic to execute instructions and the like. In some embodiments, processor 2710 has a cache memory 2716 to cache instructions and/or data for system 600. Cache memory 2716 may be organized into a hierarchal structure including one or more levels of cache memory.

In some embodiments, processor 2710 includes a memory controller 2714, which is operable to perform functions that enable the processor 2710 to access and communicate with memory 2730 that includes a volatile memory 2732 and/or a non-volatile memory 2734. In some embodiments, processor 2710 is coupled with memory 2730 and chipset 2720. Processor 2710 may also be coupled to a wireless antenna 2778 to communicate with any device configured to transmit and/or receive wireless signals. In one embodiment, an interface for wireless antenna 2778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 2732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 2734 includes, but is not limited to, flash memory, phase change memory (PCM), read-only memory (ROM), electrically erasable programmable read-only memory (EEPROM), or any other type of non-volatile memory device.

Memory 2730 stores information and instructions to be executed by processor 2710. In one embodiment, memory 2730 may also store temporary variables or other intermediate information while processor 2710 is executing instructions. In the illustrated embodiment, chipset 2720 connects with processor 2710 via Point-to-Point (PtP or P-P) interfaces 2717 and 2722. Chipset 2720 enables processor 2710 to connect to other elements in system 2700. In some embodiments of the example system, interfaces 2717 and 2722 operate in accordance with a PtP communication protocol such as the Intel® QuickPath Interconnect (QPI) or the like. In other embodiments, a different interconnect may be used.

In some embodiments, chipset 2720 is operable to communicate with processor 2710, 2705N, display device 2740, and other devices, including a bus bridge 2772, a smart TV 2776, I/O devices 2774, nonvolatile memory 2760, a storage medium (such as one or more mass storage devices) 2762, a keyboard/mouse 2764, a network interface 2767, and various forms of consumer electronics 2777 (such as a PDA, smart phone, tablet etc.), etc. In one embodiment, chipset 2720 couples with these devices through an interface 2724. Chipset 2720 may also be coupled to a wireless antenna 2778 to communicate with any device configured to transmit and/or receive wireless signals.

Chipset 2720 connects to display device 2740 via interface 2726. Display 2740 may be, for example, a liquid crystal display (LCD), a plasma display, cathode ray tube (CRT) display, or any other form of visual display device. In some embodiments of the example system, processor 2710 and chipset 2720 are merged into a single SOC. In addition, chipset 2720 connects to one or more buses 2750 and 2755 that interconnect various system elements, such as I/O devices 2774, nonvolatile memory 2760, storage medium 2762, a keyboard/mouse 2764, and network interface 2767. Buses 2750 and 2755 may be interconnected together via a bus bridge 2772.

In one embodiment, mass storage device 2762 includes, but is not limited to, a solid state drive, a hard disk drive, a universal serial bus flash memory drive, or any other form of computer data storage medium. In one embodiment, network interface 2767 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 27 are depicted as separate blocks within the system 2700, the functions performed by some of these blocks may be integrated within a single semiconductor circuit or may be implemented using two or more separate integrated circuits. For example, although cache memory 2716 is depicted as a separate block within processor 2710, cache memory 2716 (or selected embodiments of 2716) can be incorporated into processor core 2712.

Examples

Example 1 is a coreless semiconductor package comprising: a coreless plurality of layers of dielectric material in horizontal relationship with each other; a magnetic inductor at least partly embedded within a first group of the plurality of layers; an embedded multi-die interconnect bridge (EMIB) adjacent the magnetic inductor, the EMIB embedded within a second group of the plurality of layers; a plurality of vias and interconnections in the plurality of layers, configured to connect a die of the EMIB to other circuitry; a first level interconnect (FLI) on a first side of the package, the FLI configured to connect to at least some of the plurality of vias and interconnections; and a plurality of ball grid array (BGA) pockets and conductive BGA pads on a second side of the package opposite the first side of the package.

In Example 2, the subject matter of Example 1 optionally includes wherein the magnetic inductor comprises a plurality of conductive traces encapsulated by magnetic material.

In Example 3, the subject matter of Example 2 optionally includes wherein the magnetic material comprises two different types of magnetic materials.

In Example 4, the subject matter of any one or more of Examples 1-3 optionally include wherein the plurality of BGA pads comprises plated copper.

In Example 5, the subject matter of one or more of Examples 1-4 optionally include wherein the FLI comprises copper, copper-gold-palladium-silver, copper-nickel-silver, copper-tin or copper-nickel-tin.

In Example 6, the subject matter of any one or more of Examples 2-5 optionally include an organic solderability preservative deposited on at least some of the conductive BGA pads.

In Example 7, the subject matter of any one or more of Examples 1-6 optionally includes a conductive laser stop plated on a BU layer adjacent the magnetic inductor, the conductive laser stop configured to protect the magnetic inductor from chemistry process steps that are performed on at least some of the plurality of layers.

Example 8 is an electronic device comprising: one or more processor cores; memory; and a memory controller, wherein at least one of the one or more processor cores, memory, or memory controller includes a coreless semiconductor package comprising: a coreless plurality of layers of dielectric material in horizontal relationship with each other; a magnetic inductor at least partly embedded within a first group of the plurality of layers; an embedded multi-die interconnect bridge (EMIB) adjacent the magnetic inductor, the EMIB embedded within a second group of the plurality of layers; a plurality of vias and interconnections in the plurality of layers, configured to connect a die of the EMIB to other circuitry; a first level interconnect (FLI) on a first side of the package, the FLI configured to connect to at least some of the plurality of vias and interconnections; and a plurality of ball grid array (BGA) pockets and conductive BGA pads on a second side of the package opposite the first side of the package.

In Example 9, the subject matter of Example 8 optionally includes wherein the magnetic inductor comprises a plurality of conductive traces encapsulated in magnetic material.

In Example 10, the subject matter of Example 9 optionally includes wherein the magnetic material comprises two different types of magnetic materials.

In Example 11, the subject matter of any one or more of Examples 8-10 optionally include the method further comprising plating a conductive laser stop on a BU layer adjacent the magnetic inductor.

In Example 12, the subject matter of any one or more of Examples 8-11A optionally include wherein the FLI comprises copper, copper-gold-palladium-silver, copper-nickel-silver, copper-tin, or copper-nickel-tin.

In Example 13, the subject matter of any one or more of Examples 8-12 optionally include an organic solderability preservative deposited on at least some of the conductive BGA pads.

Example 14 is a method of forming a coreless semiconductor package, the method comprising: providing a peelable core; forming, by using a photolithographic process, a plurality of multi-element conductive layers on the peelable core, the multi-element conductive layers formed in a pattern of a BGA; forming on the plurality of multi-element convictive layers a coreless plurality of layers of dielectric material in horizontal relationship with each other; embedding a first magnetic material at least partly within a first group of the plurality of layers; embedding an EMIB adjacent the first magnetic material, the EMIB embedded within a second group of the plurality of layers; forming in the plurality of layers a plurality of vias and interconnections configured to connect a die of the EMIB to other circuitry; forming an FLI on a first side of the package, the FLI configured to connect to at least some of the plurality of vias and interconnections; depaneling the peelable core; and forming from the plurality of multi-element conductive layers a plurality of pockets and conductive pads on a second side of the package opposite the first side of the package.

In Example 15, the subject matter of Example 14 optionally includes enveloping a plurality of conductive traces with a second magnetic material wherein each of the conductive traces comprises a conductive pad adjacent the first magnetic material, wherein the conductive traces are encapsulated by the first magnetic material and the second magnetic material to form an inductor.

In Example 16, the subject matter of Example 15 optionally includes wherein the first magnetic material and the second magnetic material each comprises a different type of magnetic material.

In Example 17, the subject matter of any one or more of Examples 14-16 optionally include wherein solder balls are placed in contact with conductive pads within at least some of the pockets.

In Example 18, the subject matter of any one or more of Examples 14-17 optionally include depositing an organic solderability preservative on at least some of the conductive pads.

In Example 19, the subject matter of any one or more of Examples 14-18 optionally include wherein forming an FLI on a first side of the package comprises forming a solder resist (SR) layer on the first side of the package, forming SR openings (SROs) in the SR and forming the FLI in the SROs.

In Example 20, the subject matter of any one or more of Examples 14-19 optionally include wherein embedding a first magnetic material at least partly within a first group of the plurality of layers comprises drilling a cavity in at least one of the first group of the plurality of layers, depositing a protective magnetic layer in the cavity, laminating at least one BU film to fill the cavity.

In Example 21, the subject matter of Example 20 optionally includes plating a laser stop on the BU film that is horizontal to the magnetic material.

Example 22 is a method of forming a plurality of coreless semiconductor packages, the method comprising: providing a peelable core; forming, on the peelable core, by using a photolithographic process, a plurality of multi-element conductive layers on one of the plurality of layers, the multi-element conductive layers formed in a pattern of a BGA; forming on the plurality of multi-element conductive layers a coreless plurality of layers of dielectric material in horizontal relationship with each other, by a method comprising: embedding a plurality of first magnetic material at least partly within a first group of the plurality of layers; depaneling the peelable core; forming from the plurality of multi-element conductive layers a plurality of pockets and conductive pads on a second side of the package opposite a first side of the plurality of layers of dielectric material; attaching a carrier; embedding a plurality of EMIBs adjacent respective ones of the first magnetic materials, each EMIB embedded within a second group of the plurality of layers of dielectric material; forming, in the plurality of layers of dielectric material, respective vias and interconnections configured to connect a die of respective ones of the EMIB to other circuitry; forming respective FLIs on the first side of the plurality of layers of dielectric material opposite the second side of the plurality of layers of dielectric material, the FLI configured to connect to at least some of the respective vias and interconnections; and singulating the plurality of layers of dielectric material to obtain individual ones of partially completed coreless semiconductors.

In Example 23, the subject matter of Example 22 optionally includes enveloping a plurality of conductive traces with a second magnetic material wherein each of the conductive traces comprises a conductive pad adjacent the first magnetic material, and wherein the conductive traces are encapsulated by the first magnetic material and the second magnetic material to form an inductor.

In Example 24, the subject matter of Example 23 optionally includes wherein the first magnetic material and the second magnetic material each comprises a different type of magnetic material.

In Example 25, the subject matter of any one or more of Examples 22-24 optionally include wherein solder balls are placed in contact with conductive pads within at least some of the pockets.

In Example 26, the subject matter of any one or more of Examples 23-25 optionally include depositing an organic solderability preservative on at least some of the conductive pads.

In Example 27, the subject matter of any one or more of Examples 22-26 optionally include wherein forming respective FLIs on a first side of the plurality of layers of dielectric material comprises forming a solder resist (SR) layer on the first side of the plurality of layers of dielectric material, forming SR openings (SROs) in the SR and forming the respective FLIs in the SROs.

In Example 28, the subject matter of any one or more of Examples 22-27 optionally include wherein embedding a first magnetic material at least partly within a first group of the plurality of layers of dielectric material comprises forming a cavity in at least one of the first group of the plurality of layers of dielectric material, depositing a magnetic layer in the cavity, and laminating at least one BU film to fill the cavity.

In Example 29, the subject matter of any one or more of Examples 22-28 optionally include plating a protective laser stop on the BU film that fills the cavity.

In Example 30, the subject matter of any one or more of Examples 22-29 optionally include forming a protective polymer film on the at least some of the plurality of layers, and removing the polymer film after chemical processing of at least some of the plurality of dielectric layers.

In Example 31, the subject matter can include, or can optionally be combined with any portion or combination of, any portions of any one or more of Examples 1 through 30 to include, subject matter that can include means for performing any one or more of the functions of Examples 1 through 30, or a machine-readable medium including instructions that, when performed by a machine, cause the machine to perform any one or more of the functions of Examples 1 through 30.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

We claim:

1. A coreless semiconductor package comprising:
plurality of dielectric layers;
a magnetic inductor at least partly embedded within a first group of the plurality of layers;
an embedded multi-die interconnect bridge (EMIB) adjacent the magnetic inductor, the EMIB embedded within a second group of the plurality of layers;
a plurality of vias and interconnections in the plurality of layers, configured to connect a die of the EMIB to other circuitry;
a first level interconnect (FLI) on a first side of the package, the FLI configured to connect to at least some of the plurality of vias and interconnections; and
a plurality of ball grid array (BGA) pockets and conductive BGA pads on a second side of the package opposite the first side of the package.

2. The coreless semiconductor package of claim 1 wherein the magnetic inductor comprises a plurality of conductive traces encapsulated by magnetic material.

3. The coreless semiconductor package of claim 2 wherein the magnetic material comprises two different types of magnetic materials.

4. The coreless semiconductor package of claim 1 wherein the plurality of BGA pads comprises plated copper.

5. The coreless semiconductor package of claim 1 wherein the FLI comprises copper, copper-gold-palladium-silver, copper-nickel-silver, copper-tin, or copper-nickel-tin.

6. The coreless semiconductor package of claim 2 further comprising an organic solderability preservative deposited on at least some of the conductive BGA pads.

7. The coreless semiconductor package of claim 1 further comprising a conductive laser stop plated on a BU layer adjacent the magnetic inductor, the conductive laser stop configured to protect the magnetic inductor from chemistry process steps that are performed on at least some of the plurality of layers.

8. An electronic device comprising:
one or more processor cores;
memory; and
a memory controller, wherein
    at least one of the one or more processor cores, memory, or memory controller includes a coreless semiconductor package comprising:
    a plurality of dielectric layers;
        a magnetic inductor at least partly embedded within a first group of the plurality of layers;
        an embedded multi-die interconnect bridge (EMIB) adjacent the magnetic inductor, the EMIB embedded within a second group of the plurality of layers;
        a plurality of vias and interconnections in the plurality of layers, configured to connect a die of the EMIB to other circuitry;
        a first level interconnect (FLI) on a first side of the package, the FLI configured to connect to at least some of the plurality of vias and interconnections; and
        a plurality of ball grid array (BGA) pockets and conductive BGA pads on a second side of the package opposite the first side of the package.

9. The electronic device of claim 8 wherein the magnetic inductor comprises a plurality of conductive traces encapsulated in magnetic material.

10. The electronic device of claim 9 wherein the magnetic material comprises two different types of magnetic materials.

11. The electronic device of claim 8 the method further comprising plating a conductive laser stop on a BU layer adjacent the magnetic inductor.

12. The electronic device of claim 9 wherein the FLI comprises copper, copper-gold-palladium-silver, copper-nickel-silver, copper-tin, or copper-nickel-tin.

13. The electronic device of claim 8 further comprising an organic solderability preservative deposited on at least some of the conductive BGA pads.

14. A method of forming a coreless semiconductor package, the method comprising:
    providing a peelable core;
    forming, by using a photolithographic process, a coreless plurality of multi-element conductive layers on the peelable core, the multi-element conductive layers formed in a pattern of a BGA;
    forming on the plurality of multi-element convictive layers a plurality of dielectric layers;
    embedding a first magnetic material at least partly within a first group of the plurality of layers;
    embedding an EMIB adjacent the first magnetic material, the EMIB embedded within a second group of the plurality of layers;
    forming in the plurality of layers a plurality of vias and interconnections configured to connect a die of the EMIB to other circuitry;
    forming an FLI on a first side of the package, the FLI configured to connect to at least some of the plurality of vias and interconnections;
    depaneling the peelable core; and
    forming from the plurality of multi-element conductive layers a plurality of pockets and conductive pads on a second side of the package opposite the first side of the package.

15. The method of claim 14 further comprising:
enveloping a plurality of conductive traces with a second magnetic material wherein each of the conductive traces comprises a conductive pad adjacent the first magnetic material, wherein the conductive traces are encapsulated by the first magnetic material and the second magnetic material to form an inductor.

16. The method of claim 15 wherein the first magnetic material and the second magnetic material each comprises a different type of magnetic material.

17. The method of claim 14 wherein solder balls are placed in contact with conductive pads within at least some of the pockets.

18. The method of claim 15 further comprising depositing an organic solderability preservative on at least some of the conductive pads.

19. The method of claim 14 wherein forming an FLI on a first side of the package comprises forming a solder resist (SR) layer on the first side of the package, forming SR openings (SROs) in the SR and forming the FLI in the SROs.

20. The method of claim 14 wherein embedding a first magnetic material at least partly within a first group of the plurality of layers comprises drilling a cavity in at least one of the first group of the plurality of layers, depositing a protective magnetic layer in the cavity, and laminating at least one BU film to fill the cavity.

21. The method of claim 20 further comprising plating a laser stop on the BU film that fills the cavity.

22. A method of forming a plurality of coreless semiconductor packages, the method comprising:
    providing a peelable core;
    forming, on the peelable core, by using a photolithographic process, a plurality of multi-element conductive layers on one of the plurality of layers, the multi-element conductive layers formed in a pattern of a BGA;
    forming on the plurality of multi-element conductive layers a plurality of dielectric layers, by a method comprising:
        embedding a plurality of a first magnetic material at least partly within a first group of the plurality of layers of dielectric material;
        depaneling the peelable core;
        forming from the plurality of multi-element conductive layers a plurality of pockets and conductive pads on a second side of the package opposite a first side of the plurality of layers of dielectric material;
        attaching a carrier;
        embedding a plurality of EMIBs adjacent respective ones of the first magnetic materials, each EMIB embedded within a second group of the plurality of layers of dielectric material;
        forming, in the plurality of layers of dielectric material, respective vias and interconnections configured to connect a die of respective ones of the EMIB to other circuitry;
        forming respective FLIs on the first side of the plurality of layers of dielectric material opposite the second side of the plurality of layers, the FLI configured to connect to at least some of the respective vias and interconnections; and
        singulating the plurality of layers of dielectric material to obtain individual ones of partially completed coreless semiconductors.

23. The method of claim 22 further comprising:
    enveloping a plurality of conductive traces with a second magnetic material wherein each of the conductive traces comprises a conductive pad adjacent the first magnetic material, and wherein the conductive traces are encapsulated by the first magnetic material and the second magnetic material to form an inductor.

24. The method of claim 23 wherein the first magnetic material and the second magnetic material each comprises a different type of magnetic material.

25. The method of claim 22 wherein solder balls are placed in contact with conductive pads within at least some of the pockets.

26. The method of claim 23 further comprising depositing an organic solderability preservative on at least some of the conductive pads.

27. The method of claim 22 wherein forming respective FLIs on a first side of the plurality of layers of dielectric material comprises forming a solder resist (SR) layer on the first side of the plurality of layers of dielectric material, forming SR openings (SROs) in the SR and forming the respective FLIs in the SROs.

28. The method of claim 22 wherein embedding a first magnetic material at least partly within a first group of the plurality of layers of dielectric material comprises forming a cavity in at least one of the first group of the plurality of layers of dielectric material, depositing a magnetic layer in the cavity, and laminating at least one BU film to fill the cavity.

29. The method of claim 28 further comprising, plating a protective laser stop on the BU film that fills the cavity.

30. The method of claim 22 further comprising forming a protective polymer film on the at least some of the plurality of layers, and removing the polymer film after chemical processing of at least some of the plurality of dielectric layers.

* * * * *